(12) United States Patent
Lee

(10) Patent No.: US 6,597,032 B1
(45) Date of Patent: Jul. 22, 2003

(54) METAL-INSULATOR-METAL (MIM) CAPACITORS

(75) Inventor: Hyae-Ryoung Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/495,881

(22) Filed: Feb. 1, 2000

(30) Foreign Application Priority Data

Feb. 4, 1999 (KR) .......................................... 1999-3786

(51) Int. Cl.[7] .......................... H01L 29/76; H01L 29/94; H01L 31/062; H01L 31/113; H01L 31/119
(52) U.S. Cl. .......................... 257/303; 257/296; 257/301; 257/306; 257/532
(58) Field of Search ................................ 257/296, 308, 257/301, 303, 306, 295, 310

(56) References Cited

U.S. PATENT DOCUMENTS

| | | | | | |
|---|---|---|---|---|---|
| 5,627,391 | A | * | 5/1997 | Shimada et al. | 257/310 |
| 5,918,135 | A | * | 6/1999 | Lee et al. | 438/393 |
| 5,969,406 | A | | 10/1999 | Bergemont | 257/535 |
| 5,970,367 | A | | 10/1999 | Wanlass | 438/479 |
| 5,976,968 | A | | 11/1999 | Dai | 438/622 |
| 5,989,623 | A | | 11/1999 | Chen et al. | 427/97 |
| 5,989,997 | A | | 11/1999 | Lin et al. | 438/622 |
| 6,001,414 | A | | 12/1999 | Huang et al. | 427/96 |
| 6,001,733 | A | | 12/1999 | Huang et al. | 438/633 |
| 6,001,735 | A | | 12/1999 | Tsai | 438/638 |
| 6,004,188 | A | | 12/1999 | Roy | 451/41 |
| 6,008,114 | A | * | 12/1999 | Li | 438/618 |
| 6,025,226 | A | * | 2/2000 | Gambino et al. | 438/244 |
| 6,072,210 | A | * | 6/2000 | Choi | 257/703 |
| 6,103,456 | A | * | 8/2000 | Tobben et al. | 430/317 |
| 6,107,657 | A | * | 8/2000 | Arita et al. | 257/295 |
| 6,130,450 | A | * | 10/2000 | Kohyama et al. | 257/306 |
| 6,143,646 | A | * | 11/2000 | Wetzel | 438/637 |
| 6,166,424 | A | * | 12/2000 | Mikawa et al. | 257/535 |
| 6,184,551 | B1 | * | 2/2001 | Lee et al. | 257/310 |
| 6,187,663 | B1 | * | 2/2001 | Yu et al. | 438/624 |
| 6,197,688 | B1 | * | 3/2001 | Simpson | 438/678 |
| 6,218,302 | B1 | * | 4/2001 | Braeckelmann et al. | 438/687 |
| 6,245,669 | B1 | * | 6/2001 | Fu et al. | 438/636 |
| 6,281,535 | B1 | * | 8/2001 | Ma et al. | 257/295 |
| 6,303,972 | B1 | * | 10/2001 | Agarwal | 257/532 |
| 6,320,244 | B1 | * | 11/2001 | Alers et al. | 257/534 |

* cited by examiner

Primary Examiner—Eddie Lee
Assistant Examiner—Jesse A. Fenty
(74) Attorney, Agent, or Firm—Myers Bigel Sibley & Sajovec, P.A.

(57) ABSTRACT

Metal-insulator-metal capacitors include a first capacitor electrode comprising a first metal extending on a substrate and a first electrically insulating layer comprising a first material extending on the first capacitor electrode. The first electrically insulating layer has a first opening therein that exposes a first portion of the first capacitor electrode. An electrically insulating etch-stop layer that comprises a second material different from the first material, extends on the first electrically insulating layer and has a second opening therein. A capacitor dielectric layer extends on the exposed first portion of the first capacitor electrode and on sidewalls of the first electrically insulating layer and the etch-stop layer. A second capacitor electrode that comprises a second metal extends on the capacitor dielectric layer and opposite the first capacitor electrode. The first and second metals may both comprise copper, gold or aluminum. The second capacitor electrode may also comprise a composite of a tungsten plug and another metal layer on the tungsten plug.

8 Claims, 9 Drawing Sheets

METAL-INSULATOR-METAL (MIM) CAPACITORS

RELATED APPLICATION

This application is related to Korean Application No. 99-3786, filed Feb. 4, 1999, the disclosure of which is hereby incorporated herein by reference.

FIELD OF THE INVENTION

This invention relates to integrated circuit devices and methods of forming integrated circuit devices and, more particularly, to integrated circuit capacitors and methods of forming integrated circuit capacitors.

BACKGROUND OF THE INVENTION

Integrated circuit devices frequently utilize on-chip capacitors as charge storage devices. Such integrated circuit devices may include memory devices having data storage capacitors therein. For example, in a dynamic random access memory (DRAM) device, each memory cell typically includes a respective storage capacitor. In these types of memory devices, the amount of charge held by each storage capacitor is a function of the value of the data written into the respective memory cell. To reliably store and read data from a memory cell, it is important that the C-V characteristics of each storage capacitor not vary significantly as a function of temperature and/or voltage applied across the capacitor.

One conventional method of forming an integrated circuit capacitor is illustrated by FIGS. 1 and 2a–2d. In particular, FIG. 2a illustrates the steps of forming a polysilicon layer 12 on a semiconductor substrate 10 and field oxide layer (not shown). A buffer oxide layer 14a is also formed on the polysilicon layer 12. The conductivity of the polysilicon layer 12 may then be increased by implanting dopants 15 through the buffer oxide layer 14a and into the polysilicon layer 12. These dopants may comprise N-type dopants selected from the group consisting of arsenic (As) and phosphorus (P). A silicon nitride layer 14b is then deposited on the buffer oxide layer 14a. A layer of photoresist (not shown) is then formed on the silicon nitride layer 14b and patterned using conventional techniques. As illustrated by FIG. 2b, a selective etching step is then performed by etching through the silicon nitride layer 14b, the buffer oxide layer 14a and the polysilicon layer 12 to expose the semiconductor substrate 10. The resulting structure includes a polysilicon pattern 12a having an insulating capping layer 14 thereon.

Referring now to FIG. 2c, a thermal oxidation step is performed to form thermal gate oxide layer 16. Because silicon nitride is resistant to oxidation, the gate oxide layer 16 selectively forms on the surface of the substrate 10 and on the sidewalls of the polysilicon pattern 12a, but not on an upper surface of the silicon nitride layer 14b. A blanket layer of polycide 18 is then deposited on the substrate 10 and on the polysilicon pattern 12a, as illustrated.

Referring now to FIG. 2d, a layer of photoresist (not shown) is the formed on the blanket layer of polycide 18 and patterned using conventional techniques. A selective etching step is then performed on the blanket layer of polycide 18 and the gate oxide layer 16, to define a poly-insulator-poly (PIP) capacitor, having an polycide upper capacitor electrode 18a, and define a gate electrode 18b. As illustrated by FIGS. 1 and 2d, the area of the upper capacitor electrode 18a may be smaller than the area of the lower capacitor electrode 12a.

Unfortunately, the C-V characteristics of PIP capacitors, including those formed in accordance with the method of FIGS. 1 and 2a–2d, may experience significant dependence on temperature and voltage. For example, typical voltage coefficients of capacitance (VCC) and temperature coefficients of capacitance (TCC) are 200 ppm/N (part per million per volt) and 120 ppm/° C. respectively. Moreover, because PIP capacitors may comprise electrodes having relatively high resistivity, PIP capacitors may not have acceptable high frequency switching characteristics. These limitations associated with the C-V and resistance characteristics of PIP capacitors may limit the performance of integrated circuit devices (analog and digital) that utilize PIP capacitors. Thus, notwithstanding conventional techniques to form integrated circuit capacitors having polysilicon based electrodes, there continues to be a need for improved integrated circuit capacitors and methods of forming integrated circuit capacitors.

SUMMARY OF THE INVENTION

It is therefore an object of the present invention to provide improved integrated circuit capacitors and methods of forming same.

It is another object of the present invention to provide integrated circuit capacitors having excellent VCC and TCC characteristics and methods of forming same.

It is still another object of the present invention to provide integrated circuit capacitors having improved reliability and excellent high frequency characteristics and methods of forming same.

These and other objects, advantages and features of the present invention are provided by integrated circuit capacitors having a preferred metal-insulator-metal (MIM) structure and methods of forming same. The preferred methods include the use of copper damascene processing techniques. The use of these techniques improve the VCC and TCC characteristics of the capacitors relative to conventional PIP type capacitors. In particular, integrated circuit capacitors of the present invention include a first capacitor electrode comprising a first metal extending on a substrate and a first electrically insulating layer comprising a first material extending on the first capacitor electrode. The first electrically insulating layer has a first opening therein that exposes a first portion of the first capacitor electrode. An electrically insulating etch-stop layer that comprises a second material different from the first material, extends on the first electrically insulating layer and has a second opening therein. A capacitor dielectric layer extends on the exposed first portion of the first capacitor electrode and on sidewalls of the first electrically insulating layer and the etch-stop layer. A second capacitor electrode that comprises a second metal extends on the capacitor dielectric layer and opposite the first capacitor electrode. Accordingly, a MIM capacitor comprising a first capacitor electrode, capacitor dielectric layer and second capacitor electrode is formed.

According to a preferred aspect of the present invention, the capacitor dielectric layer comprises a material selected from the group consisting of plasma-enhance tetraethylorthosilicate (PE-TEOS), plasma-enhanced oxide (PEOX), plasma-enhanced silicon nitride (PESiN), silicon oxynitride (SiON), high density plasma (HDP), tantalum pentoxide ($Ta_2O_5$), spin-on glass (SOG), $O_3$-TEOS and BST ($BaSrTiO_3$). The first and second metals also preferably comprise copper or gold. Alternatively, the first or second metal may comprise aluminum. A preferred embodiment of the present invention may also include the use of a tungsten (W) plug that extends between the capacitor dielectric layer and the second capacitor electrode. The insulating etch-stop layer may also comprise silicon oxynitride (SiON).

Preferred methods of forming integrated circuit capacitors also comprise the steps of forming a first capacitor electrode comprising a first metal on a substrate and then forming a first interlayer insulating layer comprising a first electrically insulating material, on the first capacitor electrode. An etch-stop layer comprising a second electrically insulating material different from the first electrically insulating material, is also formed on the first interlayer insulating layer. A contact hole is then formed that extends through the etch-stop layer and the first interlayer insulating layer and exposes a portion of the first capacitor electrode. Next, a capacitor dielectric layer is formed on the exposed portion of the first capacitor electrode and on sidewalls of the first interlayer insulating layer and the etch-stop layer. The MIM capacitor structure may then be completed by forming second capacitor electrode comprising a second metal on the capacitor dielectric layer.

Description of Preferred Embodiments

Figure 1:
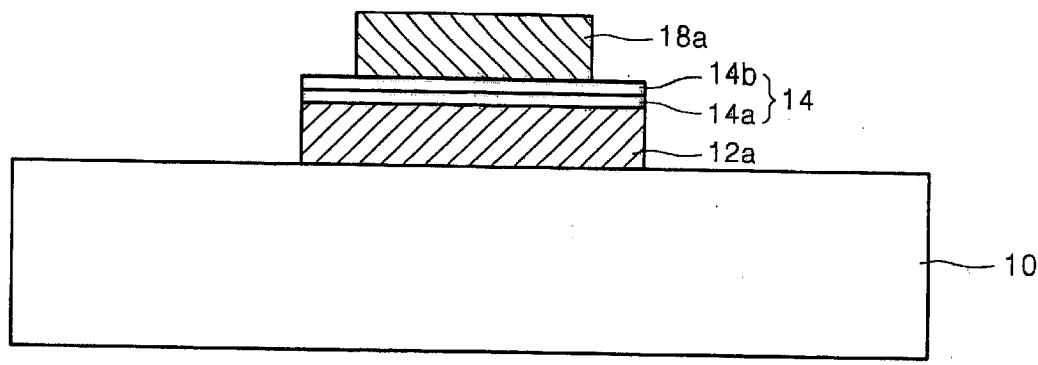
FIGS. 1 and 2a–2d are cross-sectional views of intermediate structures that illustrate a conventional method of forming an integrated circuit capacitor.
Figure 2A:
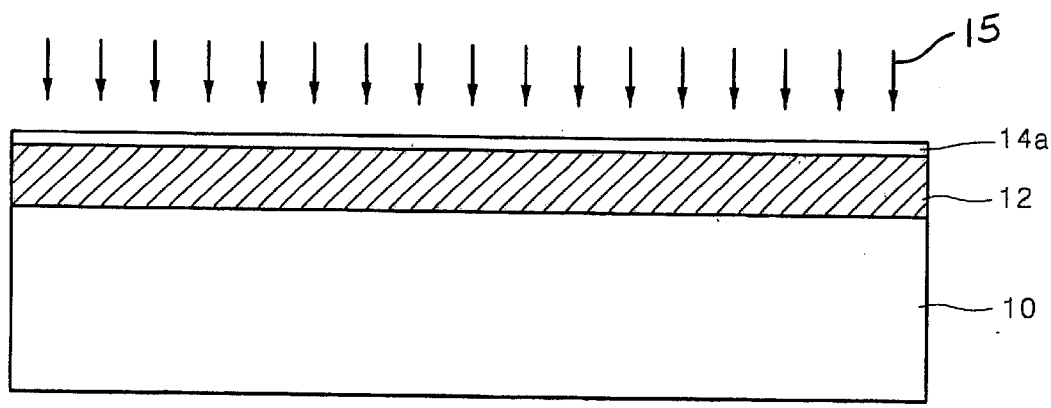
Figure 2B:
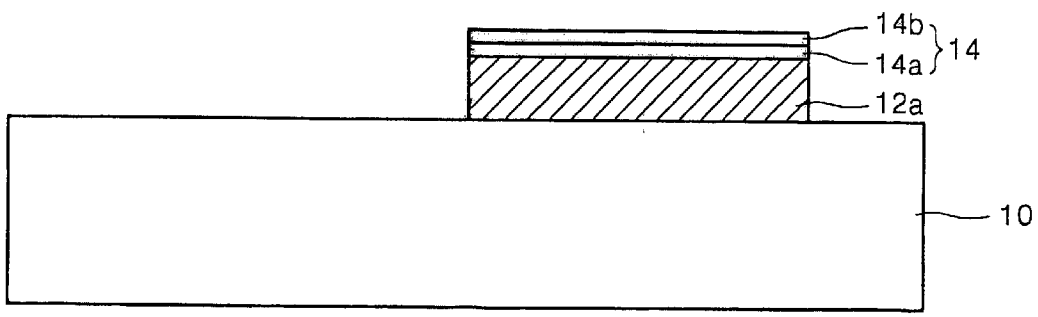
Figure 2C:
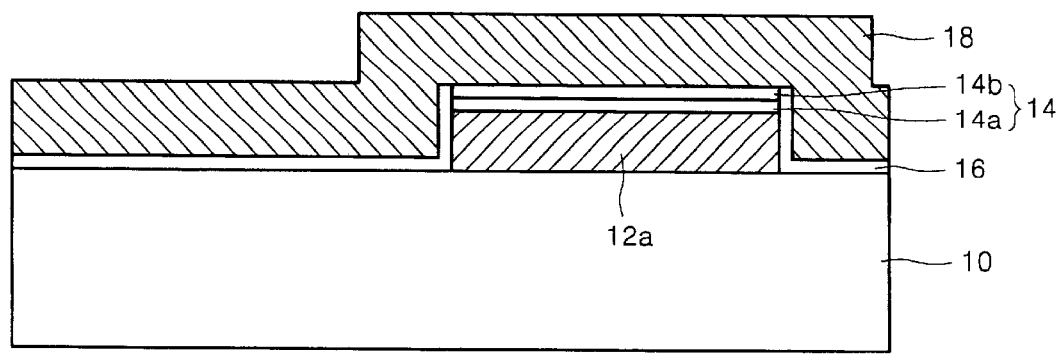
Figure 2D:
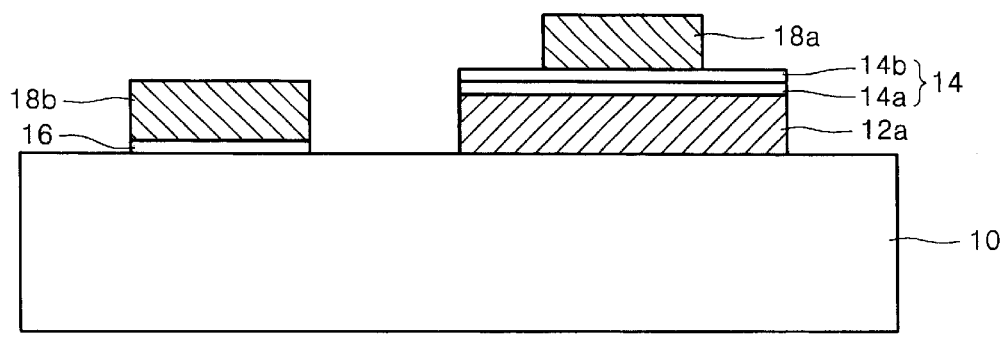

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
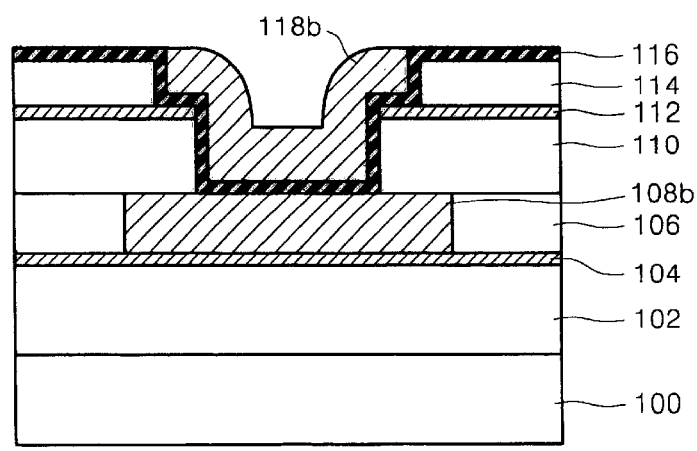
FIGS. 3 and 4a–4e are cross-sectional views of intermediate structures that illustrate methods of forming integrated circuit capacitors according to a first embodiment of the present invention.
Figure 4A:
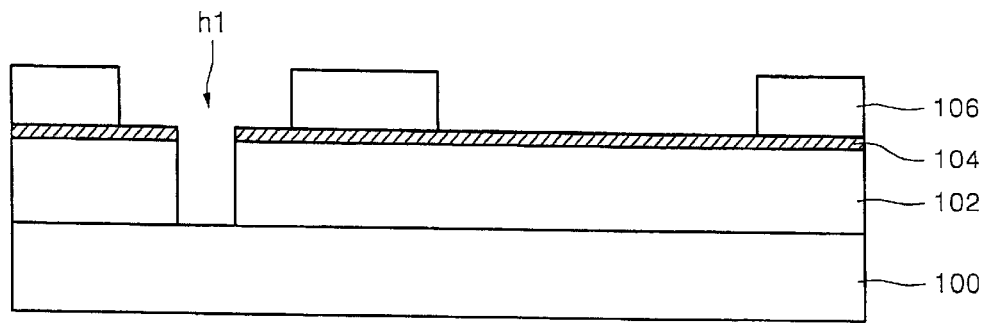

Referring now to FIGS. 3 and 4a–4e, preferred methods of forming an integrated circuit capacitor according to a first embodiment of the present invention will be described. In particular, FIG. 4a illustrates the steps of forming a first interlayer insulating layer 102 on a semiconductor substrate 100. The first interlayer insulating layer 102 may comprise silicon dioxide. A first etch-stop layer 104 and second interlayer insulating layer 106 are then formed in sequence on the first interlayer insulating layer 102. The first etch-stop layer 104 may comprise an electrically insulating material such as silicon nitride (SiN) or silicon oxynitride (SiON).

Figure 4B:
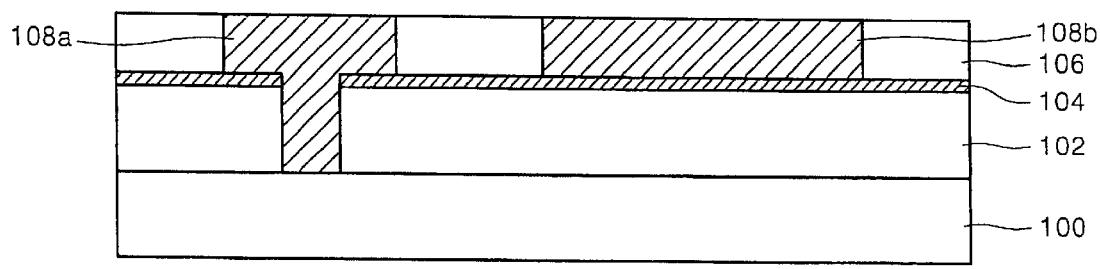

A layer of photoresist (not shown) is then formed on an upper surface of the second interlayer insulating layer 106. This layer of photoresist is then patterned using conventional techniques. The patterned layer of photoresist is then used as an etching mask during the step of selectively etching the second interlayer insulating layer 106. This selective etching step is performed until the underlying first etch-stop layer 104 is exposed. Another selective etching step is then performed to define a first contact hole hi that extends through the first etch-stop layer 104 and the first interlayer insulating layer 102 and exposes the underlying substrate 100. The first contact hole hi also exposes sidewalls of the first etch-stop layer 104 and the first interlayer insulating layer 102. Referring now to FIG. 4b, a first blanket metal layer is then conformally deposited onto the second interlayer insulating layer 106 and into the first contact hole h1. This blanket metal layer may comprise copper (Cu) or gold (Au), for example. A planarization step is then performed to define a first wiring line 108a and a lower capacitor electrode 108b. This planarization step may be performed using conventional chemical-mechanical polishing (CMP) techniques.

Figure 4C:
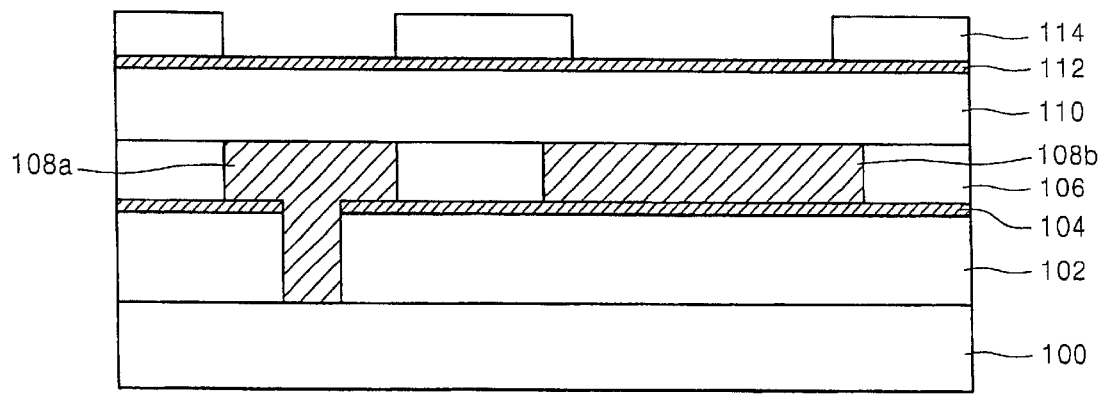

Referring now to FIG. 4c, a third interlayer insulating layer 110 is deposited on the structure of FIG. 4b. A second etch-stop layer 112 and a fourth interlayer insulating layer 114 are then deposited in sequence on the third interlayer insulating layer 110. Like the first etch-stop layer 104, the second etch-stop layer 112 may comprise silicon nitride or silicon oxynitride, for example. A layer of photoresist (not shown) is then formed on an upper surface of the fourth interlayer insulating layer 114. This layer of photoresist may then be patterned using conventional exposure and developing techniques. The patterned layer of photoresist can then be used as an etching mask during the step of selectively etching the fourth interlayer insulating layer 114 to expose portions of the second etch-stop layer 112.

Figure 4D:
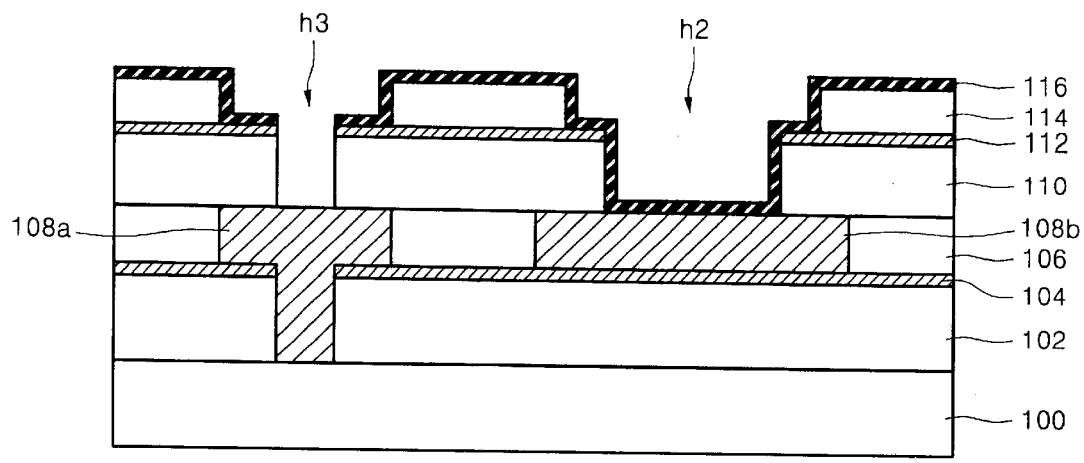

Referring now to FIG. 4d, another selective etching step is then performed to define a second contact hole h2. The second contact hole h2 extends through the second etch-stop layer 112 and the third interlayer insulating layer 110 and exposes the lower capacitor electrode 108b, as illustrated. A layer 116 of dielectric material is then conformally deposited onto the fourth interlayer insulating layer 114 and into the second contact hole h2. This deposition step may be performed using a chemical vapor deposition (CVD) technique. The dielectric material may comprise plasma-enhance tetraethyl-ortho-silicate (PE-TEOS), plasma-enhanced oxide (PEOX), plasma-enhanced silicon nitride (PESiN), silicon oxynitride (SiON), high density plasma (HDP), tantalum pentoxide ($Ta_2O_5$), spin-on glass (SOG), $O_3$-TEOS and BST ($BaSrTiO_3$), for example. After deposition of the layer 116 of dielectric material, an additional selective etching step is performed using an patterned photoresist layer (not shown) as an etching mask. During this etching step, the layer 116 of dielectric material, the second etch-stop layer 112 and the third interlayer insulating layer 110 are etched in sequence to define a third contact hole h3 that exposes a portion of an upper surface of the first wiring line 108a.

Figure 4E:
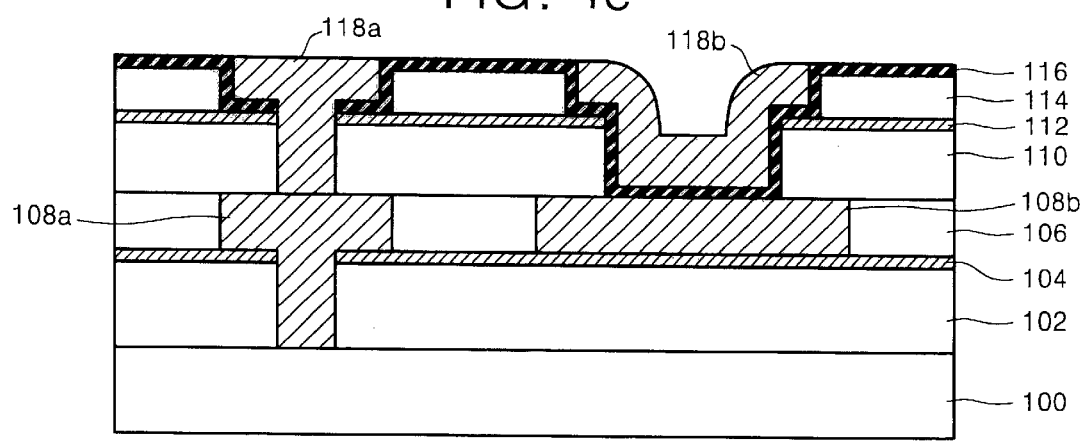

Referring now to FIGS. 3 and 4e, a second blanket metal layer is then conformally deposited onto the layer 116 of dielectric material and into the second and third contact holes h2 and h3. This second blanket metal layer may also comprise copper (Cu) or gold (Au), for example. The second blanket metal layer may then be planarized to define a second wiring line 118a (that ohmically contacts the first wiring line 108a) and an upper capacitor electrode 118a. Accordingly, a metal-insulator-metal (MIM) type capacitor can be formed in accordance with the methods illustrated by FIGS. 3 and 4a–4e. Moreover, the lower and upper electrodes of the MIM capacitor can be formed of copper using copper damascene processes. According to another aspect of this embodiment of the present invention, electrically insulating capping layers (not shown) may be formed at intermediate stages of processing. For example, a first capping layer may be formed on the first wiring line 108a and on the lower capacitor electrode 108b after the steps illustrated by FIG. 4b have been performed. The first capping layer may comprise silicon oxynitride (SiON) and may act as a protective layer in the event subsequently formed contact holes are misaligned during processing. A second capping layer may also be formed (as a protection layer) on the second wiring line 118a and on the upper capacitor electrode 118b, after the steps illustrated by FIG. 4e have been performed. These capping layers may also be selectively etched during processing to expose underlying structures. In addition, barrier metal layers (not shown) may be deposited into the first and third contact holes hi and h3 prior to formation of the first wiring line 108a and the second wiring line 118a, respectively. These barrier metal layers may be used to improve (e.g., lower) contact resistance. The barrier metal layers may comprise a material selected from the group consisting of Ti, Ta, W, Mo, TiN, TiW, TaN, MoN, W—N, W—Si—N, Ta—Si—N, W—B—N and Ti—Si—N.

Figure 5A:
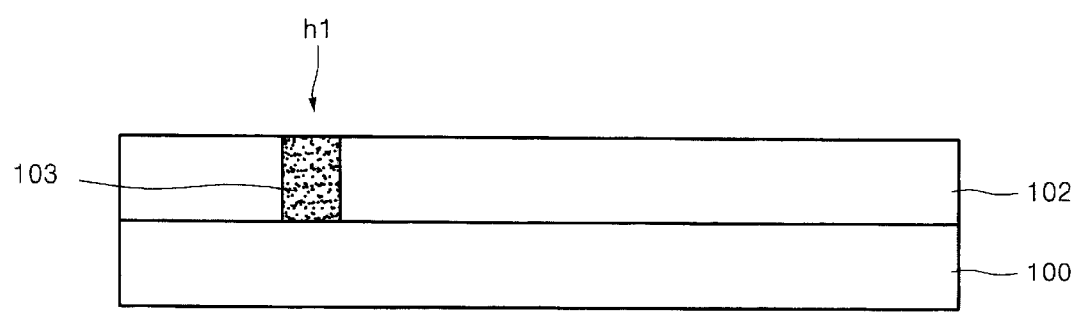
FIGS. 5a–5e are cross-sectional views of intermediate structures that illustrate methods of forming integrated circuit capacitors according to a second embodiment of the present invention.

Referring to FIGS. 5a–5e, preferred methods of forming an integrated circuit capacitor according to a second embodiment of the present invention will be described. In particular, FIG. 5a illustrates the steps of forming a first interlayer insulating layer 102 on a semiconductor substrate 100. The first interlayer insulating layer 102 may comprise silicon dioxide. Using a conventional photolithographically defined etching mask, a first contact hole hi may be formed in the first interlayer insulating layer 102. This first contact hole is then filled with a conductive plug 103 comprising a material such as tungsten (W). This step may be performed by depositing a blanket layer of tungsten and then planarizing the blanket layer until an upper surface of the first interlayer insulating layer 102 is exposed.

Figure 5B:
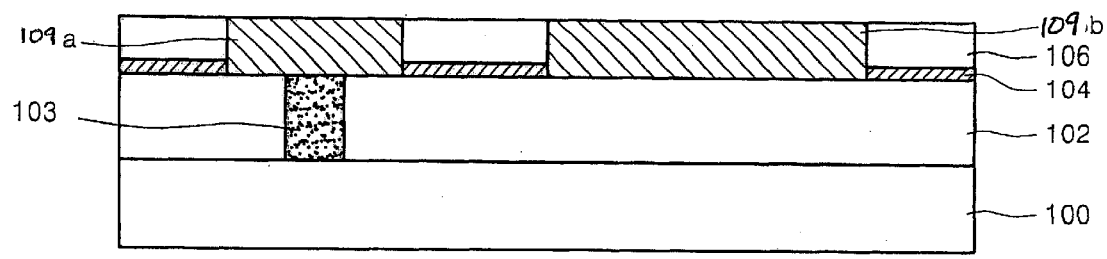

Referring now to FIG. 5b, a first etch-stop layer 104 and a second interlayer insulating layer 106 are then formed in sequence on the first interlayer insulating layer 102. The first etch-stop layer 104 may comprise an electrically insulating material such as silicon nitride (SiN) or silicon oxynitride (SiON). A layer of photoresist (not shown) may then be formed on an upper surface of the second interlayer insulating layer 106. This layer of photoresist is then patterned using conventional techniques. The patterned layer of photoresist is then used as an etching mask during the step of selectively etching the second interlayer insulating layer 106. This selective etching step is performed until the first interlayer insulating layer 102 is exposed and the conductive plug 103 is exposed, as illustrated. A first blanket metal layer is then conformally deposited onto the second interlayer insulating layer 106 and onto the exposed portions of the first interlayer insulating layer 102 and onto the conductive plug 103 to form an ohmic contact therewith. This blanket metal layer may comprise copper (Cu) or gold (Au), for example. A conventional metallization technique is then performed on the blanket metal layer to define a first wiring line 109a and a lower capacitor electrode 109b.

Figure 5C:
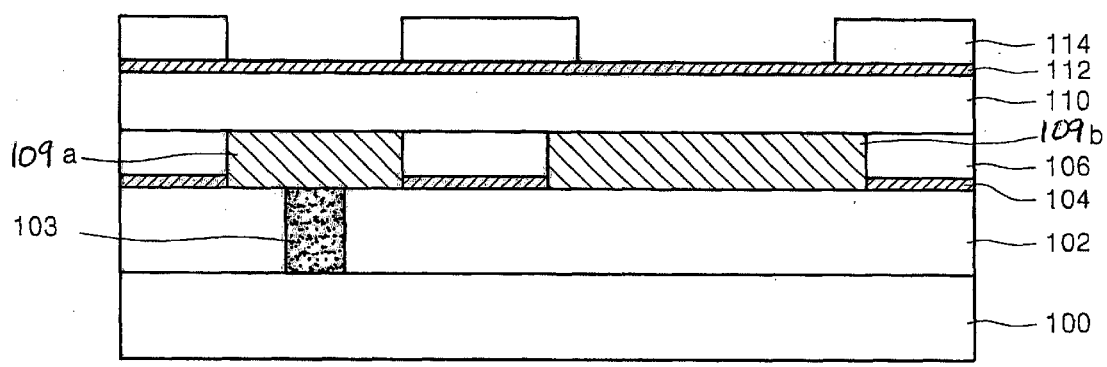

Referring now to FIG. 5c, a third interlayer insulating layer 110 is deposited on the structure of FIG. 5b. A second etch-stop layer 112 and fourth interlayer insulating layer 114 are then deposited in sequence on the third interlayer insulating layer 110. Like the first etch-stop layer 104, the second etch-stop layer 112 may comprise silicon nitride or silicon oxynitride, for example. A layer of photoresist (not shown) may then be formed on an upper surface of the fourth interlayer insulating layer 114. This layer of photoresist is then patterned using conventional techniques. The patterned layer of photoresist is then used as an etching mask during the step of selectively etching the fourth interlayer insulating layer 114 to expose selected portions of the second etch-stop layer 112.

Figure 5D:
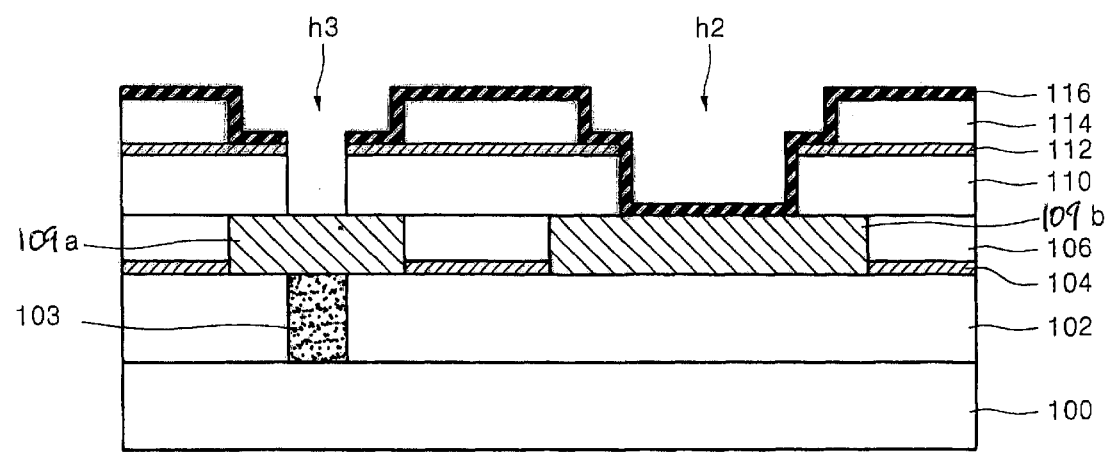

Referring now to FIG. 5d, another selective etching step is then performed to define a second contact hole h2. The second contact hole h2 extends through the second etch-stop layer 112 and through the third interlayer insulating layer 110 and exposes a portion of the lower capacitor electrode 109b, as illustrated. A layer 116 of dielectric material is then conformally deposited onto the fourth interlayer insulating layer 114 and into the second contact hole h2. This deposition step may be performed using a chemical vapor deposition (CVD) technique. The dielectric material may comprise plasma-enhance tetra-ethyl-ortho-silicate (PE-TEOS), plasma-enhanced oxide (PEOX), plasma-enhanced silicon nitride (PESiN), silicon oxynitride (SiON), high density plasma (HDP), tantalum pentoxide ($Ta_2O_5$), spin-on glass (SOG), $O_3$-TEOS and BST ($BaSrTiO_3$), for example. After deposition of the layer 116 of dielectric material, an additional selective etching step is performed using an patterned photoresist layer (not shown) as an etching mask. During this etching step, the layer 116 of dielectric material, the second etch-stop layer 112 and the third interlayer insulating layer 110 are etched in sequence to define a third contact hole h3 that exposes a portion of an upper surface of the first wiring line 109a.

Figure 5E:
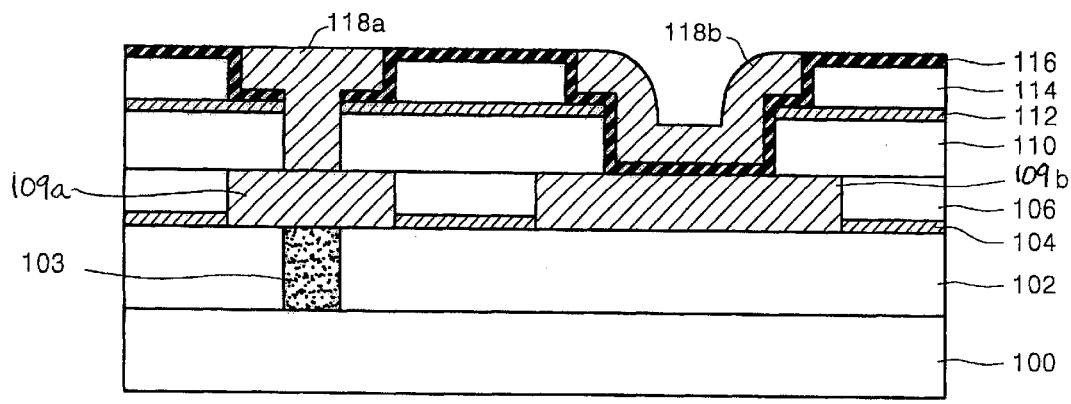

Referring now to FIG. 5e, a second blanket metal layer is then conformally deposited onto the layer 116 of dielectric material and into the second and third contact holes h2 and h3. This second blanket metal layer may also comprise copper (Cu) or gold (Au), for example. The second blanket metal layer may then be planarized to define a second wiring line 118a (that ohmically contacts the first wiring line 109a) and an upper capacitor electrode 118a. Accordingly, a metal-insulator-metal (MIM) type capacitor can be formed in accordance with the methods illustrated by FIGS. 5a–5e. Like the first embodiment, electrically insulating capping layers and barrier metal layers may be formed during intermediate stages of processing.

Figure 6:
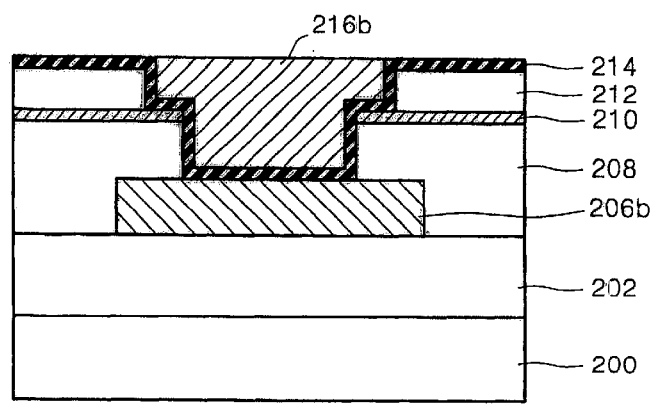
FIGS. 6 and 7a–7d are cross-sectional views of intermediate structures that illustrate methods of forming integrated circuit capacitors according to a third embodiment of the present invention.
Figure 7A:
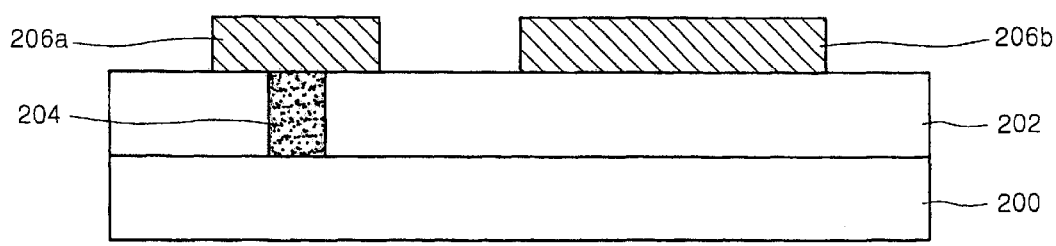

Referring now to FIGS. 6 and 7a–7d, preferred methods of forming an integrated circuit capacitor according to a third embodiment of the present invention will be described. In particular, FIG. 7a illustrates the steps of forming a first interlayer insulating layer 202 on a semiconductor substrate 200. The first interlayer insulating layer 202 may comprise silicon dioxide. As described above with respect to the second embodiment of the present invention, the first interlayer insulating layer 202 is then selectively etched to define a contact hole therein. This contact hole is then filled with a conductive plug comprising a material such as tungsten (W). Prior to formation of the conductive plug 204, a barrier metal layer (not shown) may be deposited into a bottom of the contact hole to lower the contact resistance between the conductive plug 204 and the substrate 200.

A first wiring line 206a and a lower capacitor electrode 206b are then formed on the first interlayer insulating layer 202, as illustrated. The first wiring line 206a ohmically contacts the conductive plug 204. The first wiring line 206a and the lower capacitor electrode 206b may be formed by depositing a conductive layer comprising aluminum (Al), for example, and then patterning the deposited conductive layer by selectively etching the deposited layer using a patterned photoresist mask (not shown). Other metal patterning techniques may also be used. This etching step may be preceded by the step of forming a capping layer (e.g., SiON capping layer), as described above, on the deposited conductive layer or on the patterned regions defined therefrom. As illustrated, the first wiring line 206a electrically contacts the conductive plug 204.

Figure 7B:
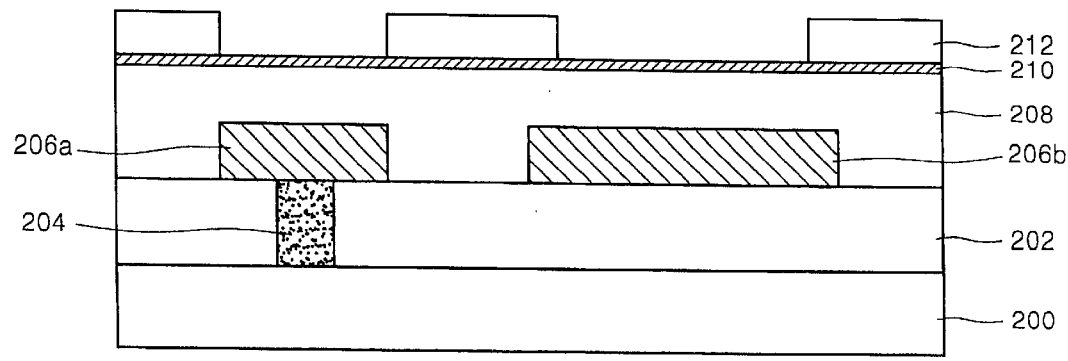

Referring now to FIG. 7b, a second interlayer insulating layer 208 is then deposited onto the first interlayer insulating layer 202 and onto the first wiring line 206a and onto the lower capacitor electrode 206b, as illustrated. An etch-stop layer 210 and a third interlayer insulating layer 212 are then deposited in sequence on the second interlayer insulating layer 208. The third interlayer insulating layer 212 is then patterned using conventional techniques, to expose selected underlying portions of the etch-stop layer 210.

Figure 7C:
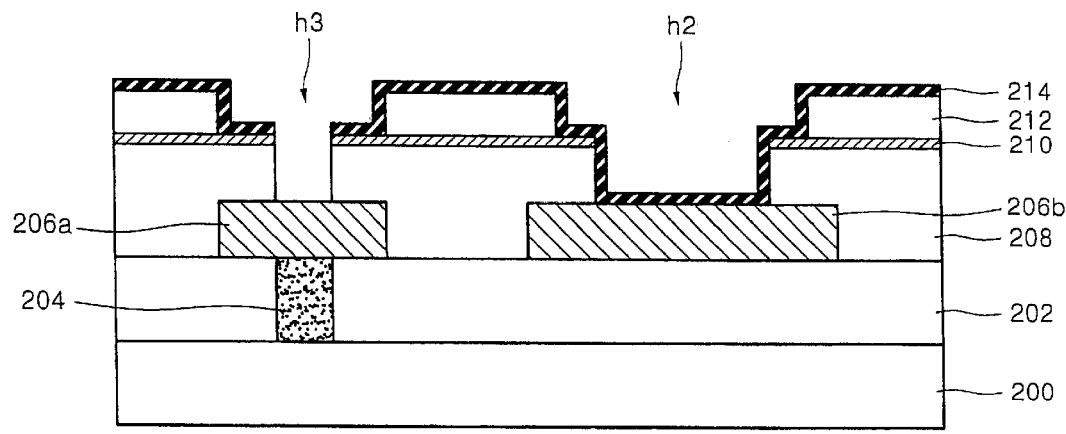

Referring now to FIG. 7c, another selective etching step is then performed on the structure of FIG. 7b to define a second contact hole h2. The second contact hole h2 extends through the second etch-stop layer 210 and the third interlayer insulating layer 208 and exposes the lower capacitor electrode 206b. A layer 214 of dielectric material is then conformally deposited onto the fourth interlayer insulating layer 212 and into the second contact hole h2. This deposition step may be performed using a chemical vapor deposition (CVD) technique. The dielectric material may comprise plasma-enhance tetra-ethyl-ortho-silicate (PE-TEOS), plasma-enhanced oxide (PEOX), plasma-enhanced silicon nitride (PESiN), silicon oxynitride (SiON), high density plasma (HDP), tantalum pentoxide ($Ta_2O_5$), spin-on glass (SOG), $O_3$-TEOS and BST ($BaSrTiO_3$), for example. After deposition of the layer 214 of dielectric material, an additional selective etching step is performed using an patterned photoresist layer (not shown) as an etching mask. During this etching step, the layer 214 of dielectric material, the second etch-stop layer 210 and the third interlayer insulating layer 208 are etched in sequence to define a third contact hole h3 that exposes a portion of an upper surface of the first wiring line 206a.

Figure 7D:
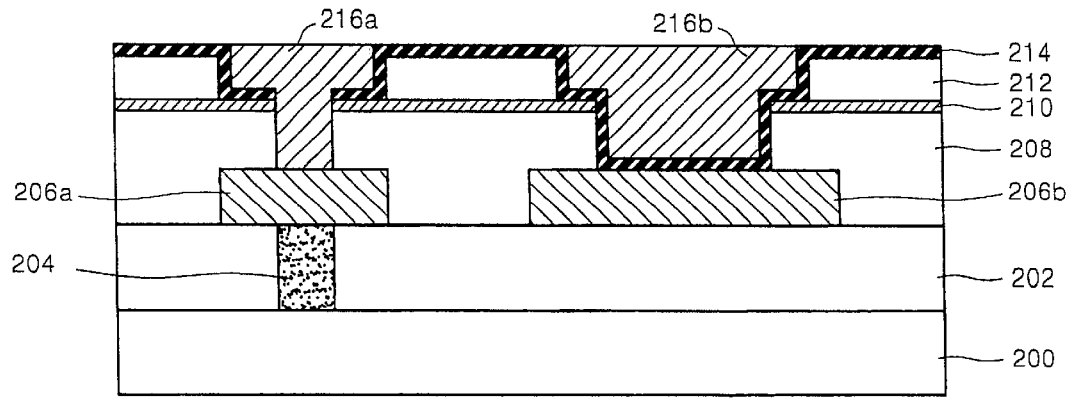

Referring now to FIGS. 6 and 7d, a second blanket metal layer is then conformally deposited onto the layer 214 of dielectric material and into the second and third contact holes h2 and h3. This second blanket metal layer may also comprise copper (Cu) or gold (Au), for example. The second blanket metal layer may then be planarized to define a second wiring line 216a (that ohmically contacts the first wiring line 206a) and an upper capacitor electrode 216b. Accordingly, a metal-insulator-metal (MIM) type capacitor can be formed in accordance with the methods illustrated by FIGS. 6 and 7a–7d. A capping layer (not shown) may also be formed (as a protection layer) on the second wiring line 216a and on the upper capacitor electrode 216b, after the steps illustrated by FIG. 7d have been performed.

Figure 8:
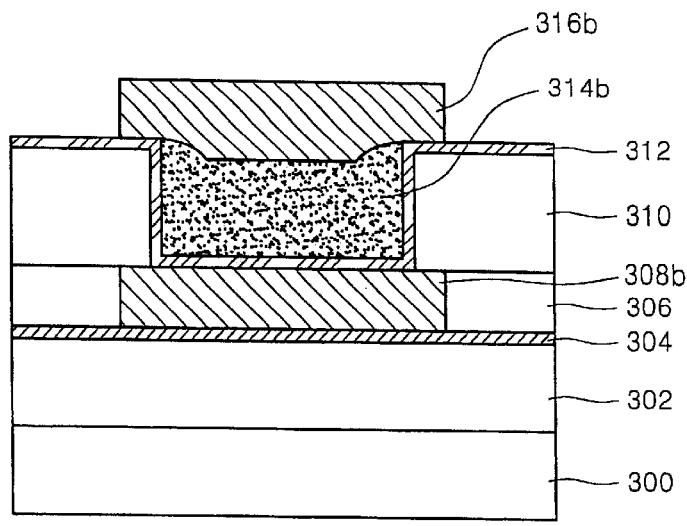
FIGS. 8 and 9a–9d are cross-sectional views of intermediate structures that illustrate methods of forming integrated circuit capacitors according to a fourth embodiment of the present invention.
Figure 9A:
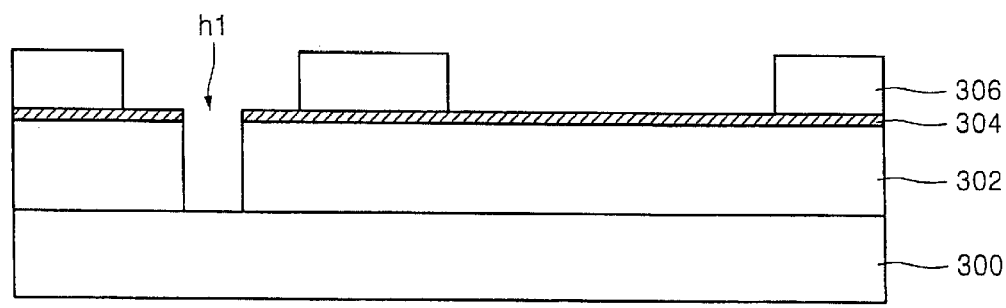

Referring now to FIGS. 8 and 9a–9d, preferred methods of forming integrated circuit capacitors according to a fourth embodiment of the present invention will be described. In particular, FIG. 9a illustrates the steps of forming a first interlayer insulating layer 302 on a semiconductor substrate 300. A first etch-stop layer 304 and a second interlayer insulating layer 306 are then formed in sequence on the first interlayer insulating layer 302. A step is then performed to selectively etch the second interlayer insulating layer 306 until portions of the first etch-stop layer 304 are exposed, using a photoresist mask (not shown) as an etching mask. Following this etching step, another selective etching step is performed to define a first contact hole hi by etching through the first etch-stop layer 304 and through the first interlayer insulating layer 302 and exposing the underlying substrate 300.

Figure 9B:
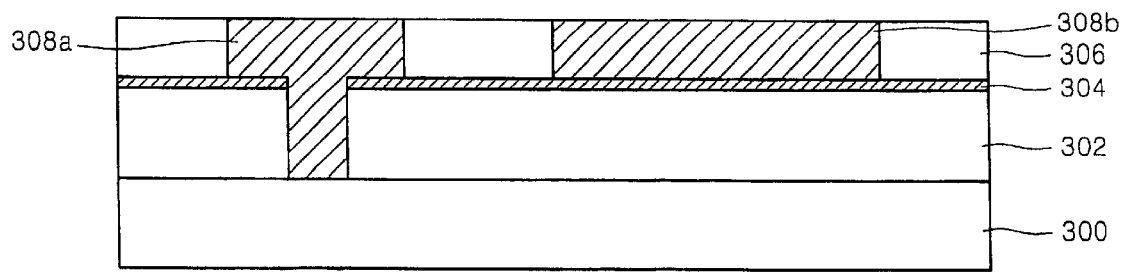
Figure 9C:
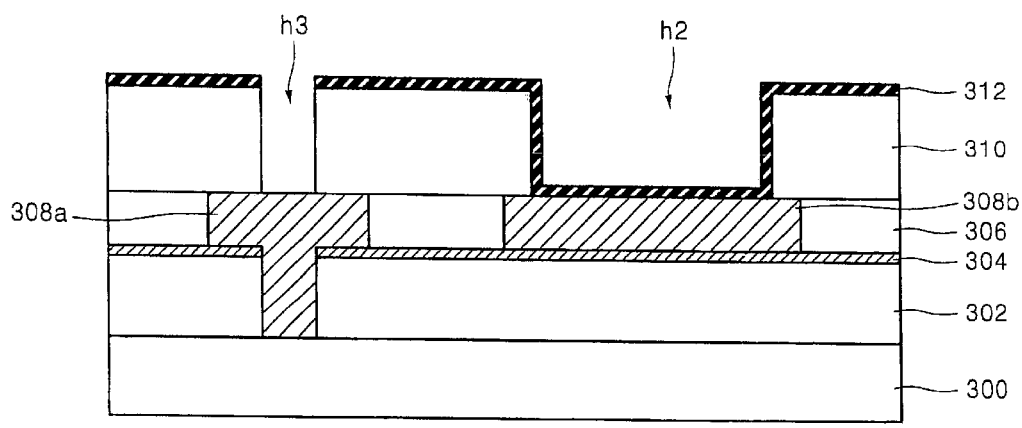

Referring now to FIG. 9b, a first wiring line 308a and a lower capacitor electrode 308b are then formed by conformally depositing a blanket metal layer on the structure of FIG. 9a and then planarizing the deposited layer using the second interlayer insulating layer 306 as a planarization stop layer. Referring now to FIG. 9c, a third interlayer insulating layer 310 is then formed on the structure of FIG. 9b. The third interlayer insulating layer 310 is then patterned to define a second contact hole h2 therein that exposes the lower capacitor electrode 308a. A layer of dielectric material 312 is then conformally deposited onto the third interlayer insulating layer 310 and into the second contact hole h2. A selective etching step is then performed to etch through the layer of dielectric material 312 and the third interlayer insulating layer 310 in sequence to define a third contact hole h3 that exposes the first wiring line 308a.

Figure 9D:
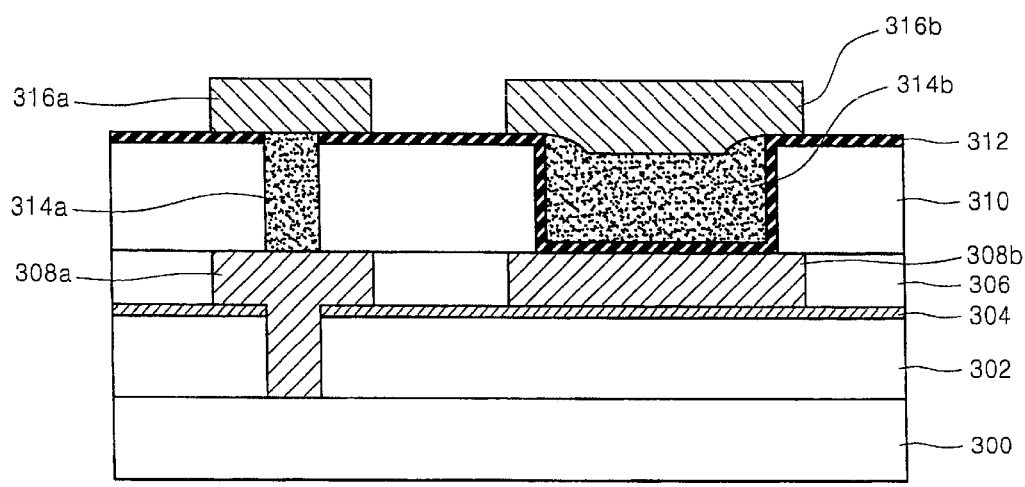

As illustrated by FIGS. 8 and 9d, a blanket layer of a conductive material such as tungsten (W) is then conformally deposited on the structure of FIG. 9c. A planarization or etch-back step is then performed on the blanket layer of conductive material, using the third interlayer insulating layer 310 as a planarization or etch stop layer. This planarization step results in the formation of first and second conductive plugs 314a and 314b, respectively. Another blanket layer of conductive material such as aluminum (Al) is then deposited on the third interlayer insulating layer 310 and on the first and second conductive plugs 314a and 314b. This blanket layer of conductive material is then patterned to define a second wiring line 316a and an upper capacitor electrode. The upper capacitor electrode comprises the conductive pattern 316b in combination with the second conductive plug 314b. Thus, according to this embodiment, only one copper demascene process is required when forming the first wiring line 308a and lower capacitor electrode 308a. Like the first, second and third embodiments, additional capping layers (not shown) and barrier metal layers (not shown) may be formed at intermediate processing steps.

According to preferred aspects of the present invention, the use of copper damascene processing techniques during formation of MIM integrated circuit capacitors improves the electrical characteristics of capacitors. For example, when compared to conventional methods of forming PIP capacitors, the value of VCC for MIM capacitors formed in accordance with the present invention can be achieved at levels in a range between about 0.166 and 0.2 times the value of VCC for conventional PIP capacitors. Also, the value of TCC for MIM capacitors formed in accordance with the present invention can be achieved at levels below about 0.5 times the value of TCC for conventional PIP capacitors. Thus, MIM capacitors according to the present invention can be expected to have improved C-V characteristics (lower voltage and temperature dependence and improved high frequency performance). These improvements can also be expected to improve the bit resolution characteristics of memory cells that utilize these MIM capacitors (relative to PIP type capacitors).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit capacitor, comprising:
   a first capacitor electrode comprising a first metal and extending on a substrate;
   a first electrically insulating layer comprising silicon dioxide extending on said first capacitor electrode and having a first opening therein that exposes a first portion of said first capacitor electrode;
   an electrically insulating etch-stop layer comprising silicon oxynitride (SiON) extending on said first electrically insulating layer and having a second opening therein;
   a capacitor dielectric layer extending on the exposed first portion of said first capacitor electrode and on sidewalls of said first electrically insulating layer and said etch-stop layer;
   a second electrically insulating layer comprising silicon dioxide on said etch-stop layer, said second electrically insulating layer having a third opening therein that exposes an upper surface of said etch-stop layer, said capacitor dielectric layer extending onto the upper surface of said etch-stop layer; and
   a second capacitor electrode comprising a second metal extending on said capacitor dielectric layer and opposite said first capacitor electrode.

2. The capacitor of claim 1, wherein said capacitor dielectric layer comprises a material selected from the group consisting of plasma-enhance tetraethylorthosilicate (PE-TEOS), plasma-enhanced oxide (PEOX), plasma-enhanced silicon nitride (PESiN), silicon oxynitride (SiON), high density plasma (HDP), tantalum pentoxide ($Ta_2O_5$), spin-on glass (SOG), $O_3$-TEOS and BST ($BaSrTiO_3$).

3. The capacitor of claim 1, wherein the first metal comprises copper (Cu) and the second metal comprises aluminum (Al).

4. The capacitor of claim 1, wherein the first and second metals comprise metals selected from the group consisting of copper (Cu) and gold (Au).

5. The capacitor of claim 1, further comprising a tungsten (W) plug extending between said capacitor dielectric layer and said second capacitor electrode.

6. The capacitor of claim 1, wherein said capacitor dielectric layer contacts a sidewall of said second electrically insulating layer.

7. An integrated circuit capacitor, comprising:
   a first capacitor electrode comprising a first metal and extending on a substrate;
   a first electrically insulating layer extending on said first capacitor electrode and having a first opening therein that exposes a first portion of said first capacitor electrode;
   a capacitor dielectric layer extending on the exposed first portion of said first capacitor electrode and contacting and extending along a sidewall of the first electrically insulating layer; and
   a second capacitor electrode comprising a composite of a tungsten plug extending in the first opening that contacts said capacitor dielectric layer and a second metal layer extending on the tungsten plug.

8. The capacitor of claim 7, wherein the first metal layer comprises copper and wherein the second metal layer comprises aluminum.

* * * * *